United States Patent [19]
Onishi

[11] Patent Number: 5,428,767
[45] Date of Patent: Jun. 27, 1995

[54] DATA RETENTION CIRCUIT

[75] Inventor: Shuji Onishi, Kyoto, Japan

[73] Assignee: Rohm Co., Ltd., Kyoto, Japan

[21] Appl. No.: 95,916

[22] Filed: Jul. 23, 1993

[30] Foreign Application Priority Data

Jul. 30, 1992 [JP] Japan .................. 4-204144
Jul. 30, 1992 [JP] Japan .................. 4-204146
Feb. 26, 1993 [JP] Japan .................. 5-037618

[51] Int. Cl.$^6$ ............................ G06F 11/00
[52] U.S. Cl. .................. 395/575; 371/2.2; 371/57.1
[58] Field of Search ............ 371/2.2, 14, 57.1, 60; 395/576

[56] References Cited

U.S. PATENT DOCUMENTS 4,926,427 5/1990 Remein .
5,130,946 7/1992 Watanabe .

FOREIGN PATENT DOCUMENTS 0431723 6/1991 European Pat. Off. .

OTHER PUBLICATIONS

*The Design of OS/2* by H. M. Deitel et al., ©1992 by Addison-Weasley Publishing Co. pp. 6 and 7.
*Operating System Concepts,* Third Edition by A. Silberschatz et al., ©1991 by Addison-Weasley Publishing Co. pp. 397-409.

Primary Examiner—Vincent P. Canney
Attorney, Agent, or Firm—Oliff & Berridge

[57] ABSTRACT

A data retention circuit prevents erroneous data from being written into a backup RAM, even when a software upset occurs so that a secure data retention can be obtained in a backup RAM of a game machine. A backup chip select signal output from an address decoder, outputs of an enable circuit, and a software upset detection circuit are used to enable a backup memory write process. The enable circuit outputs an enable signal only when a predetermined ID code signal sequence is supplied from a CPU. When inconsistency between an access pattern, a read, and a write signal occurs, the software upset detection circuit outputs a software upset detection signal. An AND gate blocks a supply of the backup chip select signal to the backup memory according to a combination of the software upset detection signal and the enable signal.

7 Claims, 3 Drawing Sheets

DATA RETENTION CIRCUIT

BACKGROUND OF THE INVENTION

1. Field of the Invention

This invention relates to a data retention circuit and more particularly to a data retention circuit which can securely prevent an erroneous write from destructing data stored in a backup random access memory (RAM) for secure data retention and a game machine provided with the data retention circuit.

2. Description of the Related Art

A conventional video game machine selects a program read from a plurality off program read-only memories (ROMs) or a cassette containing game programs by a chip select signal of an address decoder for desired processing. The address decoder selects one of tile program ROMs containing predetermined programs by a chip select signal. To save data such as the current execution state or the game result intact at any period, the address decoder can select a backup RAM and when a save signal is input, output a backup chip select signal for saving the data at the point in time. Therefore, in the video game machine, the intermediate state or the result (score) of a gate such as a roll playing game can be stored securely.

FIG. 4 shows a schematic circuit configuration of a conventional video game machine.

In FIG. 4, the video game machine is provided with a work RAM 19 and four program ROMs 11 to 14 installed in a cassette attached to a cassette cartridge or the video game machine main unit. Besides the program ROMs 11–14 and work RAM 19, a backup RAM 20 is provided.

An address decoder 21 is provided to select one of the four program ROMs 11–14, work RAM 19, and backup RAM 20; it selects one of the program ROMs 11–14 and work RAM 19 by chip select signals 21a, 21b, 21c, 21d, and 21e respectively. When a predetermined save signal is input, the address decoder 21 outputs a backup chip select signal 21f to enable the backup RAM 20.

A CPU 22 is provided to supply a desired address signal to the address decoder 21 and predetermined address signals to the ROMs 11–14, work RAM 19, and backup RAM 20. Conventional embodiment, a 4-bit address signal is supplied to the address decoder 21 and 8-bit address signals are supplied to the ROMs 11–14, work RAM 19, and backup RAM 20. As is generally known, a data storage RAM 28 is connected to the CPU 22 and an input signal through a joy stick 25 is supplied via an I/O controller to the CPU 22 and further, the operation result is displayed on a CRT 27 through a video controller 28.

Therefore, formerly, in response to a signal entered by the user through the joy stick 25 or a save signal output independently by the CPU 22, the video game machine 10 can select the backup RAM 20 by the backup chip select signal 21f from the address decoder 21 to save, each time, the processing contents made so far.

A software upset or runaway may occur during system execution by the CPU for a reason such as a bug latent in the game programs stored in the program ROMs 11–14 or a shock given to the video game machine 10.

Formerly, a watchdog timer is provided to take a predetermined action or reset the system when such a software upset occurs. If a reset signal is not sent to the watchdog timer every predetermined period, a software upset is judged to have occurred and a predetermined reset processing is performed.

However, when a save signal is input, the conventional video game machine 10 unconditionally selects the backup RAM 20 and saves the state or result at that time. Thus, when a software upset occurs in the system of the video game machine 10, a save signal may be erroneously generated causing the backup chip select signal 21f to be output by accident from the address decoder 21, in which case erroneous data is stored in the backup RAM 20.

Thus, data such as the intermediate state of the game stored is destroyed and reliability of the game machine or the programs used with the game machine degrades.

Particularly, the data which needs to be stored or retained is not frequently written, and if the data is easily lost when the software upset or the like occurs, a fatal loss will be incurred. Prevention of an erroneous write during the software upset is a great problem to be solved.

SUMMARY OF THE INVENTION

Accordingly, it is an object of the invention to provide the game machine with a data retention circuit which can securely prevent erroneous data from being written into a backup RAM, even when a software upset occurs. The data retention circuit thus provides for secure data retention in the backup RAM.

To this end, according to one embodiment of the invention, there is provided a data retention circuit comprising an address decoder which, selects one of a plurality of program ROMs and a backup RAM in response to an address signal supplied from a CPU, and an enable circuit which enables a backup chip select signal to be supplied to the backup RAM from said address decoder only when a predetermined address signal is input.

According to the invention, there is provided a game machine comprising the first embodiment of the data retention circuit.

According to another embodiment of the invention, there is provided a data retention circuit comprising an address decoder, which selects one of a plurality of program ROMs and a backup RAM in response to an address signal supplied from a CPU, and a CPU software upset detection circuit which contains a logical operation circuit which performs an operation on a chip select signal from the address decoder and a read/write signal of one of the program ROMs, wherein the software upset detection circuit outputs a software upset detection signal when an access pattern to the program ROM is inconsistent with the read/write signal.

According to the invention, there is provided a game machine comprising the second embodiment of the data retention circuit.

According to a further embodiment of the invention, there is provided a data retention circuit comprising an address decoder which selects one of a plurality of program ROMs and a backup RAM in response to an address signal supplied from a CPU, an enable circuit which enables a backup chip select signal to be supplied to the backup RAM from said address decoder only when a predetermined address signal is input, and a CPU software upset detection circuit which contains a logical operation circuit which performs an operation on a chip select signal from the address decoder and a read/write signal of one of the program ROMs, wherein the software upset detection circuit outputs a software upset detection signal when an access pattern to the program ROM is inconsistent with the read/write signal.

According to the invention, there is provided a game machine comprising the third embodiment of the data retention circuit.

Therefore, according to the invention, even if a software upset occurs, the CPU software upset detection circuit can compare an erroneous chip select signal with the read/write signal state, and use the inconsistency occurring between the chip select signal and read/write signal to detect a software upset, thereby securely preventing erroneous writing into the backup RAM when the software upset occurs.

Since the enable circuit enables backup operation only when a specific address signal is applied, erroneous writing into the backup RAM can be prevented and data is saved in the backup RAM only when backup operation is enabled.

DESCRIPTION OF THE PREFERRED EMBODIMENTS

Referring now to the accompanying drawings, there is shown a preferred embodiment of the invention.

Figure 1:
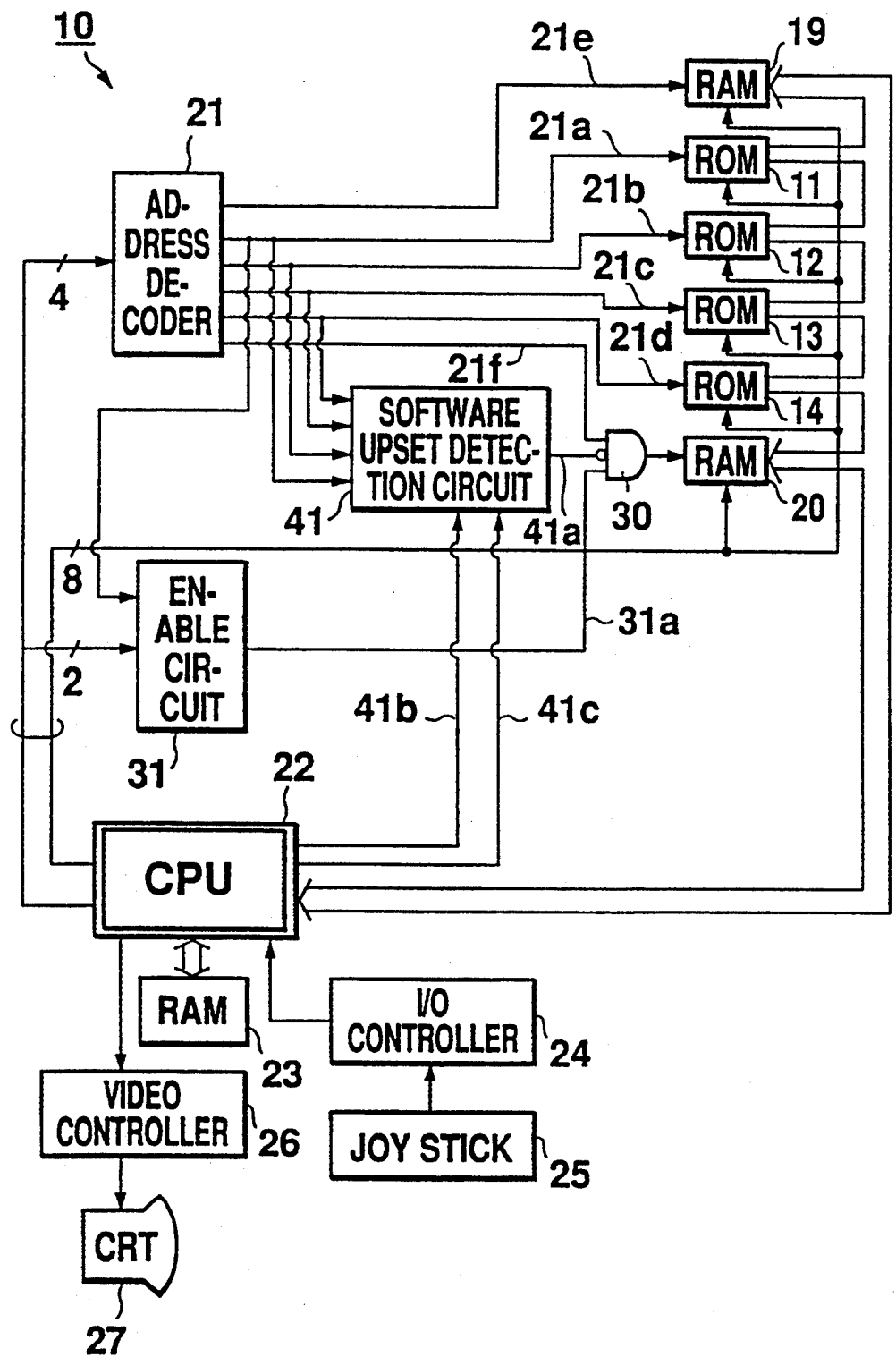
FIG. 1 is a block circuit diagram showing a data retention circuit according to a preferred embodiment of the invention.
Figure 4:
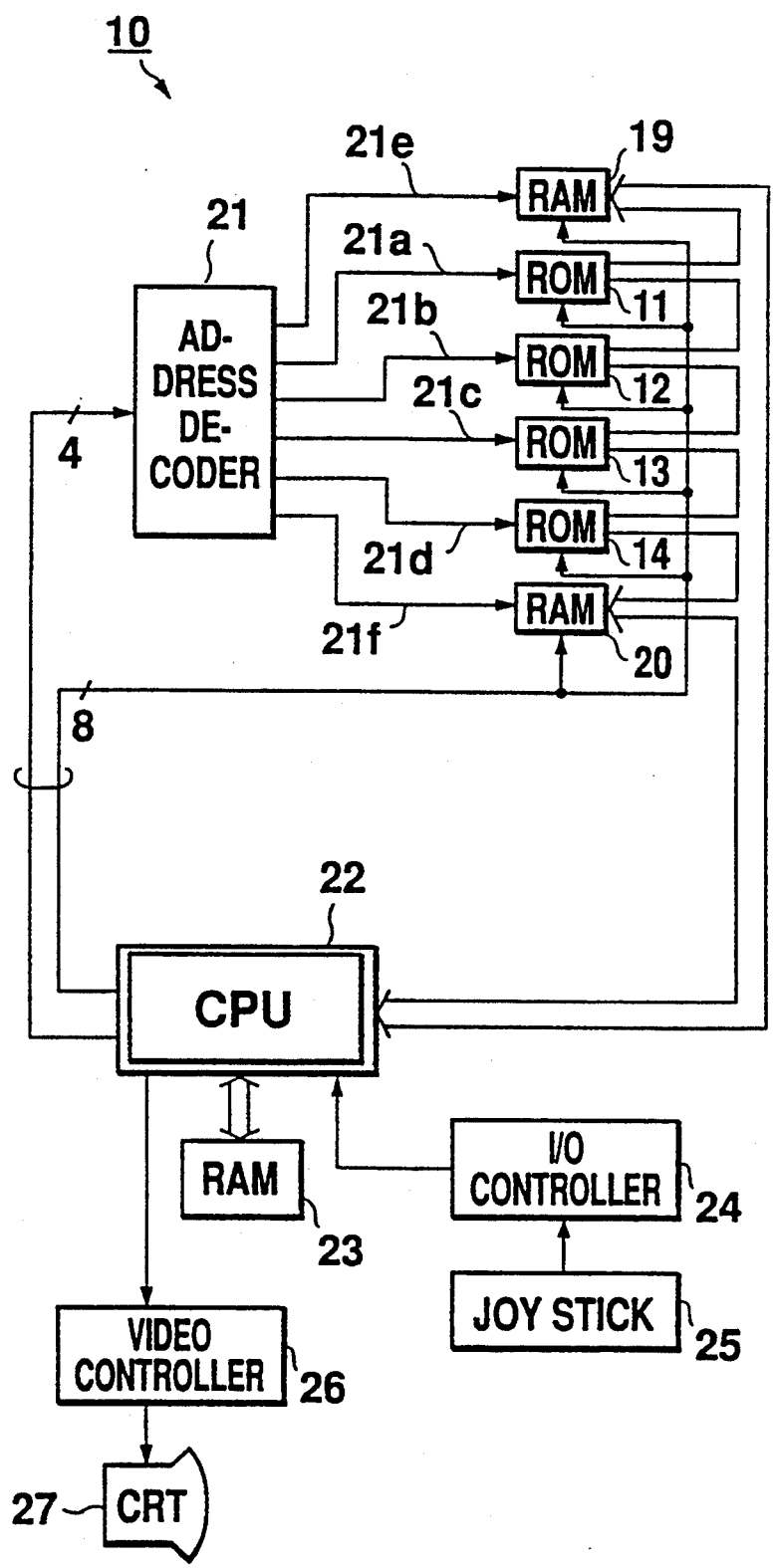
FIG. 4 is a block circuit diagram showing an example of a conventional game machine.

FIG. 1 shows a data retention circuit in a game machine according to the invention. Circuit parts identical with or similar to those previously described with reference to FIG. 4 are denoted by the same reference numerals in FIG. 1, and will not be discussed again.

The invention is characterized by a backup chip select signal 21f of an address decoder 21 which is supplied via an AND gate 30 to a backup RAM 20. The AND gate 30 is enabled after a check is made to ensure that no software upset occurred according to a combination of the presence and the absence of signal outputs from an enable circuit 31 and a software upset detection circuit 41. The enable circuit 31 and the software upset detection circuit 41 form the data retention circuit. Erroneous data can be securely prevented from being written into the backup RAM 20 for data retention by using the enable circuit 31 and the software upset detection circuit 41 to enable the AND gate 30.

The operation of the data retention circuit according to the embodiment is described.

The software upset detection circuit 41 of the data retention circuit calculates the correlation between the chip select signals 21a-21d and a read signal 41b and a write signal 41c. When an inconsistency between the memory access pattern and read/write signal occurs, the software upset detection circuit 41 detects a software upset.

Figure 2:
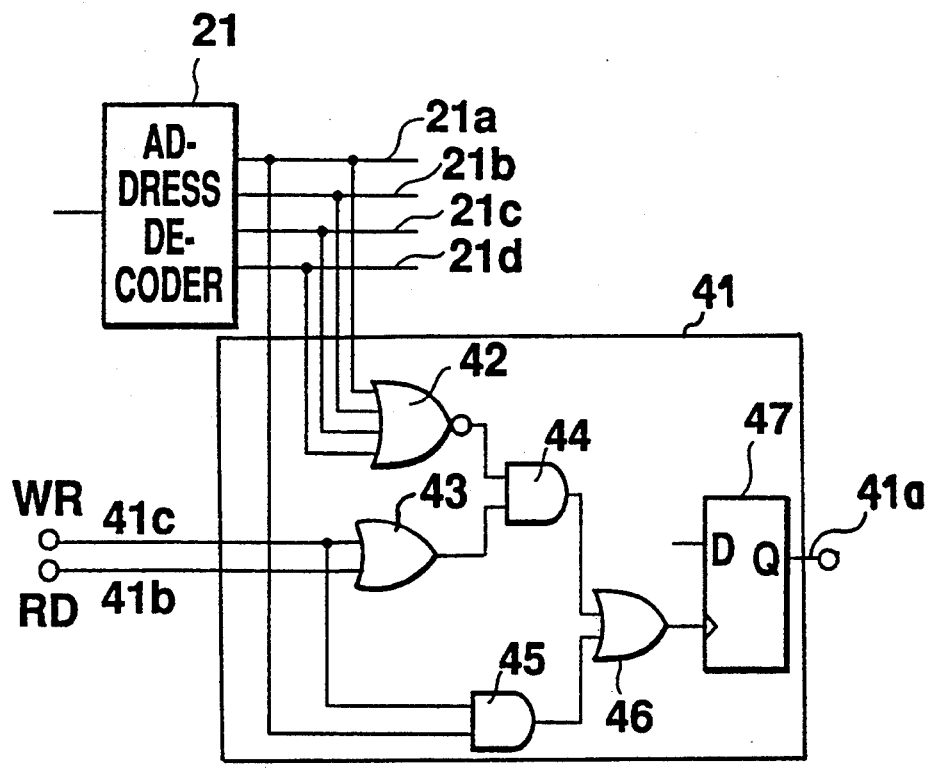
FIG. 2 is a block circuit diagram showing the main part of the data retention circuit which incorporates a software upset detection circuit according to the invention.

FIG. 2 shows the details of the configuration of the software upset detection circuit 41. The operation of the software upset detection circuit 41 is described in conjunction with FIGS. 1 and 2.

In FIG. 2, two types of comparison between the access pattern and read/write signal are made. The first comparison is enabled by a NOR gate 42 to which all of the chip select signals 21a-21d are input, an OR gate 43 which detects either a read signal RD or a write signal WR, and an AND gate 44 which ANDs the signals output from the NOR gate 42 and OR Kate 43. Therefore, according to the first software upset detection, when the read or write signal is output, at least the address decoder 21 should select one of the external memories and one of the chip select signals 21a-21d should be selected.

Therefore, when either the read signal RD or the write signal WR is output, if none of the chip select signals 21a-21d are output, it can be determined that a software upset occurs. This is because such a state means an access to an area whose address is not decoded and the access pattern is inconsistent with the read or write signal output. When such inconsistency occurs, it may be determined that a software upset occurs.

A second comparison is enabled when the program ROM 11 is selected by the chip select signal 21a. In this second comparison, the chip select signal 21a and the write signal WR are ANDed by an AND gate 45. When the signal 21a for selecting the program ROM 11 is output, it is proper that the read signal RD should be output, but it is not proper that the write signal WR should be output; when both the signals RD and WR are output, inconsistency between the access pattern and the write signal WR is judged to occur. It is caused by a software upset in almost all cases. Therefore, the output of the AND gate can be used as a software upset detection signal 41a.

Thus, the software upset detection circuit 41 in the embodiment executes two types of software upset detection. Outputs of both the AND gates 44 and 45 are input to an OR gate 46. The output of the OR Gate 46 is input to a flip-flop 47. When either of the software upsets is detected as described above, the software upset signal 41a is output from a Q terminal of the flip-flop 47.

When a memory area whose address is not decoded is accessed or when a write signal 41c into the program ROM 11 is output, it is determined that a software upset occurs, and a software upset detection signal 41a is output from the logical operation circuit.

Although the second software upset detection in the embodiment uses the chip select signal 21a for the logical operation with the write signal WR, the signal is not limited to the chip select signal 21a.

An address signal of any number of bits, such as high-order two bits, selected out of an address signal of high-order four bits input to the address decoder 21 is supplied from the CPU 22 to the enable circuit 31, which is another component of the data retention circuit. Only when the high-order address signals are supplied in a specific combination is an enable signal on the signal line 31a sent to the AND gate 30.

The specific address signal is supplied from the CPU 22 as an ID code signal sequence. When outputting a save signal to save the processing contents during execution of the current program, the CPU 22 supplies the predetermined ID code signal sequence to the enable circuit 31. For example, the ID code, as shown in FIG.

Figure 3:
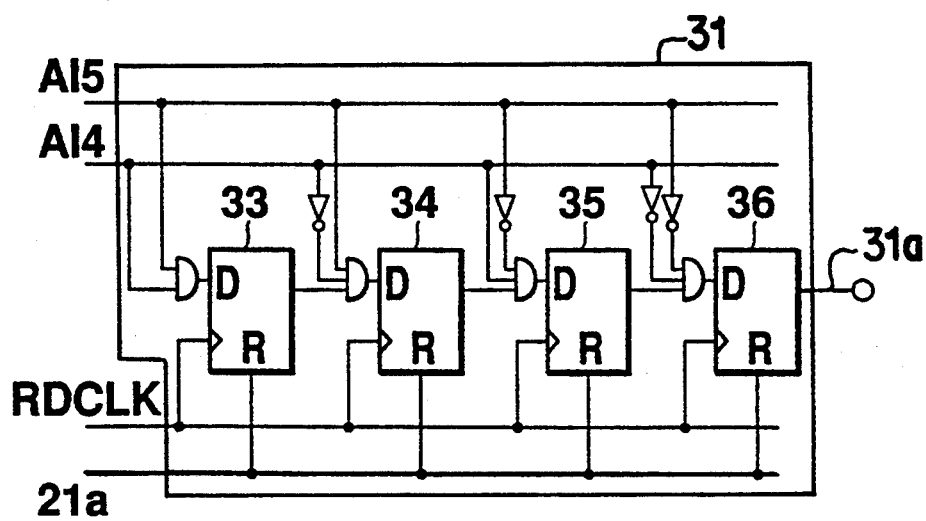
FIG. 3 is a circuit diagram showing one preferred embodiment of an enable circuit according to the invention.

3, comprises a sequence of four 2-bit signals on the signal lines A15 and A14, respectively. In FIG. 3, the 2-bit signals are "11", "10", "01", "00". The enable circuit 31 does not output an enable signal 31a to the AND gate 30 until the high-order two bit of address signals are supplied in the sequence.

Therefore, when a software upset occurs, such a specific ID code signal sequence is not provided. Even if the backup chip select signal 21f is output from the address decoder 21, a write operation into the backup RAM 20 can be prevented.

The operation of the enable circuit 31 is described in conjunction with FIGS. 1 and 3.

FIG. 3 shows a preferred embodiment of the enable circuit 31, wherein four D-type flip-flops 33 to 36 are cascaded and the high-order two bits of each signal supplied from the CPU 22 on the signal lines A15 and A14 are fed through logical circuits into the D input of each of the flip-flops 33–36.

One of the chip select signals output from the address decoders 21, such as 21a, is supplied to a reset input of each of the flip-flops 33–36 and a read clock signal RDCLK is supplied to each clock input.

The enable circuit 31 shown in FIG. 3 operates as follows. The Q outputs of each of the D-flip-flips 33–36 are set to logical low (0) whenever a logical high (1) signal is present on the signal line 21a. In addition, when the signal line 21a is logically low and a rising edge occurs on the signal line RDCLK, the logical signal, either high or low, present at the D input is passed through to the Q output.

The input to each of the D inputs of the D-flip-flops 33–36 is formed by a logical combination of the signals present on the signal lines A14 and A15 at the rising edge of the RDCLK signal. After a logical high reset signal is present on the signal line 21a, all the Q outputs of the D-flip-flops 33–36 are set to 0. Thus, a logical low signal is output on the signal line 31a. After the D-flip-flops 33–36 are reset, the output of the first D-flip-flop 33 will be set to logic high when logic high signals are present on both of the signal lines A14 and A15 and a rising edge is present on the signal line RDCLK. Then, as long as a reset signal does not subsequently occur on the signal line 21a, the output of the D-flip-flop 34 will be set to logic high when the output of the D-flip-flop 33 is logic high the output of the signal line A14 is logic low and the signal on the signal line A15 is logic high. Likewise, as long as a reset signal does not subsequently occur on the signal line 21a, the output of the third D-flip-flop 35 is set to logic high when the output of the second D-flip-flop 34 is logic high, the signal on the signal line A14 is logic high, and the signal on the signal line A15 is logic low. Finally, as long as a reset signal on the signal line 21a does not occur, the output of the fourth D-flip-flop 36 will be high when the output of the third D-flip-flop is logic high, and the signals on both the signal line A14 and the signal line A15 are logic low. Thus, the output of the fourth D-flip-flop 36, and thus the signal on the signal line 31a, will be logic high whenever the sequence of signals appears "11", "01", "10", and "00" on the signal lines A14 and A15, respectively.

Furthermore, since the outputs of each of the D-flip-flops 33–35 will be set to logical low except when the above-outlined conditions occur, none of the D-flip-flop 33–36 will output a logical high signal for more than a single clock cycle on the signal line RDCLK. Thus, the logical high enable signal will be output on the signal line 31a at most one clock cycle over the read clock signal on the signal line RDCLK.

Therefore, according to the embodiment shown in FIG. 3, an enable signal on signal line 31a is not output from a Q output of the flip-flop 36 at the last stage until the above-mentioned ID code signal sequence, "11, 10, 01, 00" is supplied.

Therefore, even when a system upset occurs on the program ROMs 11–14, erroneous data is not written into the backup RAM 20 because the predetermined ID code signal sequence is not input to the enable circuit 31 from the CPU 22.

In the embodiment in FIG. 1, the enable circuit 31 as well as the software upset detection circuit 41 is provided to prevent an erroneous write. When an enable signal on signal line 31a is not output and if a software upset detection signal 41a is not output, or when a software upset detection signal 41a is output although an enable signal 31a is output, the AND gate 30 blocks a supply of a backup chip select signal 21f from the address decoder 21 to the backup RAM 20.

Therefore, when a software upset occurs, writing into the backup RAM 20 can be securely prevented. Only when no system upset occurs and writing into the backup RAM 20 is enabled, will data be saved.

In the embodiment, the chip select signals of the address decoder are used to detect inconsistency between a given access pattern and read/write signal, as described above. However, the inconsistency detection contents are not limited to an access to a memory area whose address is not decoded or a write instruction into program ROM. A software upset can be detected with any similar pattern.

The data retention circuit according to the embodiment can also be applied to a game machine used by changing a cassette containing a game; it can be incorporated in the game machine main unit or the cassette.

According to the invention, software upset detection formerly made by a watchdog timer is executed by using the chip select signals of the address decoder. Thus a software upset containing a periodical reset that cannot be detected by the watchdog timer can also be securely detected. When a system upset occurs, erroneous writing into the backup RAM and destruction of data written in the backup RAM are securely prevented.

The chip select control of program ROMs and backup RAM and the enable circuit can securely prevent erroneous writing into the backup RAM when a system upset occurs, and enables data to be securely saved only when no system upset occurs and writing into the backup RAM is enabled, thereby improving reliability of the game machine installing the data retention circuit.

What is claimed is:

1. A data retention circuit, comprising:
   an address decoder generating at least a backup RAM memory select signal in response to an address signal; and
   an enable circuit enabling the backup RAM memory select signal to be supplied to a backup RAM only upon a predetermined address signal sequence being input to the enable circuit.

2. A game machine including the data retention circuit as claimed in claim 1.

3. A data retention circuit, comprising:

an address decoder generating one of a plurality of memory select signals in response to an address signal; and a CPU software upset detection circuit generating a software upset detection signal based on the plurality of memory select signals, a read signal, and a write signal.

4. A game machine including the data retention circuit as claimed in claim 3.

5. A data retention circuit, comprising:

an address decoder generating at least a backup RAM memory select signal in response to an address signal;

an enable circuit generating a backup RAM chip select enable signal only upon a predetermined address signal sequence being input to the enable circuit;

a CPU software upset detection circuit generating a software upset detection signal based on the plurality of memory select signals, a read signal, and a write signal; and a backup chip select circuit generating a backup chip select signal to a backup memory device by logically combining one of the backup RAM memory select signal, the software upset detection signal, and the backup RAM chip select enable signal.

6. A game machine including the data retention circuit as claimed in claim 5.

7. The data retention circuit of claim 3, further comprising a backup RAM chip select circuit generating a backup RAM chip select signal to a backup memory device by logically combining the backup RAM memory select signal, the software upset detection signal, and the backup RAM chip select enable signal.

* * * * *